United States Patent [19]

Almy

[11] Patent Number: 4,670,858

[45] Date of Patent: Jun. 2, 1987

[54] HIGH STORAGE CAPACITY ASSOCIATIVE MEMORY

[75] Inventor: Thomas A. Almy, Tualatin, Oreg.

[73] Assignee: Tektronix, Inc., Beaverton, Oreg.

[21] Appl. No.: 502,047

[22] Filed: Jun. 7, 1983

[51] Int. Cl.[4] .......................................... G11C 13/00
[52] U.S. Cl. ..................................... 365/49; 364/200
[58] Field of Search ......................... 365/49; 364/200

[56] References Cited

U.S. PATENT DOCUMENTS

| | | | |
|---|---|---|---|
| 3,221,157 | 11/1965 | Fleisher et al. | 365/49 |
| 3,518,631 | 6/1970 | Lindquist et al. | 365/49 |
| 3,685,020 | 8/1972 | Meade | 365/49 |
| 4,219,883 | 8/1980 | Kobayashi et al. | 365/49 |

Primary Examiner—Terrell W. Fears
Attorney, Agent, or Firm—Allston L. Jones; John Smith-Hill; Robert S. Hulse

[57] ABSTRACT

An associative memory having a large storage capacity which also has the capability of being used as a conventional memory, i.e. accessed by physical location. A memory array (11) is accessed in conventional fashion by an address decoder (15). A mask/data drive circuit (13) controls the loading/reading of the memory array (11) when the device is in a conventional mode, and operates on the same pins to provide mask and search data when the drive is in the associative mode. In the associative mode, a plurality of match detect (17) circuits, one for each word location in memory (11), receive the output signals from the memory array (11). The match detect circuits (17) prioritize the output match signals from memory (11) and provide an output indicating the first or lowest word in memory (11) having a match. An address encoder (19) is responsive to the prioritized match output (if any) from the match detect circuits (17) to determine the physical location in memory (11) containing the matched word.

14 Claims, 5 Drawing Figures

HIGH STORAGE CAPACITY ASSOCIATIVE MEMORY

DESCRIPTION

1. Technical Field

This invention relates to the art of associative memories, which are storage devices constructed in such a manner that every cell in the memory can be simultaneously addressed and hence searched.

2. Background of the Invention

An associative memory is searched by content as opposed to physical location. As in other memories, the individual cells comprising the associative memory each contain one bit of information. A given number of sequential bits form a word of data. In an associative memory search, the words in memory are all compared simultaneously (in parallel) against a known search pattern comprising a series of data bits. Any matches are detected and the physical locations of the cells containing matched data are determined. The primary advantage of an associative memory is that a search of the entire memory may be made quickly, essentially in the time that it takes to make a search of one word.

Associative memories in general, however, have a disadvantage in that they have a relatively small storage capacity, even when implemented in the form of intergrated circuits, because of the need for external pin connections to each memory cell. The need for individual pin connections substantially limits the extent to which the cell size of the memory may be decreased through state-of-the-art integration techiques. It is thus generally desirable to decrease the pin count in associative memories, which results in a corresponding increase in the storage capacity of the associative memory for a given amount of physical memory space.

Further, the structural implementation of an associative memory typically requires a substantial amount of external logic circuitry, which adds both to the size and expense of an associative memory. Hence, it is desirable to minimize the external logic in an associative memory device. These problems have been recognized to an extent by the art, as evidenced by U.S. Pat. No. 4,257,110 to Lamb et al, and U.S. Pat. No. 4,159,538 to Motsch.

SUMMARY OF THE INVENTION

The associative memory of the present invention includes an associative memory array, which includes means for searching the data in the memory associatively for words stored in the memory which match with a given search pattern; means providing a search pattern and a masking signal to the memory array and for accessing matched words in the memory array; a plurality of match detect circuit means, one for each word location in the memory array, the plurality of match detect circuit means providing an output associated with the location of the first match in the memory array means; and means responsive to the match detect circuit means to determine the physical location of the memory array containing the first match.

Further, the associative memory may incorporate means for accessing the memory array by physical location and means for loading data into the memory array reading data from the memory array, so that the memory of the present invention can operate convientionally as well as associatively.

BEST MODE CARRYING OUT THE INVENTION

Figure 1:
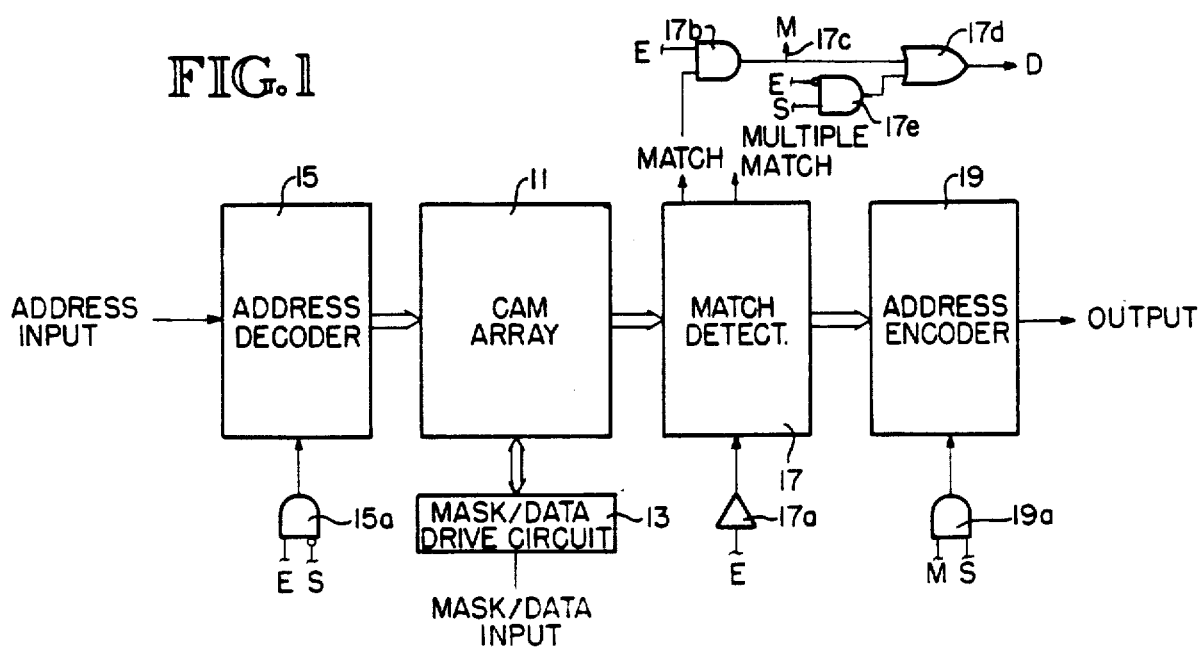
FIG. 1 is a generalized block diagram of an associative memory device embodying the principles of the present invention.

FIG. 1 shows a generalized block diagram of the associative memory device of the present invention. Data is stored in a 256×16 CAM (content addressable memory) array 11. The CAM array 11 stores a given number of data words, all of the same bit length. A mask/data drive block 13 and an address decoder 15 both directly access CAM 11. Match/detect block 17 comprises a plurality of match/detect circuits, one for each word in CAM 11. Each word location in CAM 11 has an output line upon which is indicated a match or non-match for that word when an associative search is performed. The output lines from CAM 11 are applied to respective match/detect circuits. The output signals of the match/detect circuits, one for each word location, are then applied to an address encoder 19, which provides the memory output signal. All of the above-described circuitry is typically implemented in a single chip, which thus significantly reduces the amount of additional external logic circuitry necessary for the associative memory.

The control logic for the memory is also shown in FIG. 1. The address encoder 15 is enabled by the output signal from AND gate 15a when the chip enable "E" signal is high and the associative mode "S" signal is low. The match detect circuits 17 are enabled through inverter 17a when there has not been a match in any previous match detect circuits. Address encoder 19 is enabled through AND gate 19a when the match (M) line is high and the S signal is also high, indicating associative mode. Control logic is also provided at the match output terminal from match detect block 17. The match signal is applied to an AND gate 17b. The output signal of AND gate 17b is high when the E signal is high and the match line is high. An M signal output is provided on line 17c. The output signal of AND gate 17b is applied to one input terminal of OR gate 17d. The other input terminal is coupled to receive the output signal from AND gate 17e which is high when the E signal is low and the S signal is high. The output signal of OR gate 17d is a disable signal which disables the next chip in the memory.

The use of the address encoder and decoder, to multiplex and demultiplex signal lines relative to CAM 11, as well as the novel structure of the individual match-/detect circuit and the mask/data drive circuit, as explained in more detail in the following paragraphs, results in a reduction in the pin count necessary for CAM 11. This reduction in pin count permits an increase in the density of data storage in the present associative memory over similar conventional associative memories.

In operation, the apparatus of FIG. 1 can be utilized in a conventional mode where the CAM functions as a RAM (random access memory), and the data in the memory is addressed on a physical location basic by address decoder 15. Decoder 15 is conventional and is thus not described in detail herein. The address encoder 19 is not enabled when the apparatus is operating in the conventional mode, as explained above. In the conventional mode, data is written into and read out of memory through the mask/data drive circuit 13, in a manner explained in more detail below.

When the device is to operate in an associative mode, the address decoder 15 is not enabled, while the address encoder 19 is enabled, by the control logic, as explained above. A selected search word which is to be used for the search of the CAM is provided to the mask/data circuit 13. Mask signals, in a selected pattern, are provided by mask/data circuit 13. Each memory location containing a data word is searched in parallel, i.e. simultaneously, against the search pattern resulting from the selected masking of the individual bit positions of the search word. The signals on the output lines from each such memory location indicate a match or non-match for the word in that location. Also, data may by read/written from the CAM in those bit positions of the search word not used for the associative search.

The output signals from CAM 11 are applied to the match detect circuits 17. The one match detect circuit associated with the first or lowermost word location in the associative memory structure producing a match provides an output indicating a match. The outputs of all the other match detect circuits do not indicate match, i.e. indicate a non-match, even if a match does in fact exist for their associated words in memory. Thus, match detect block 17 in effect acts as a match signal prioritizing circuit. Each match detect circuit in block 17 produces a match signal and a multiple match signal (if a match had also occurred in lower words in memory) which are passed on to the next highest match detect circuit. The one actual match output signal (if any) from the block of match detect circuits 17 is then passed to address encoder 19, which is a conventional multiplexer. Encoder 19 encodes or determines the address of the physical location in CAM 11 containing the match.

Figure 2:
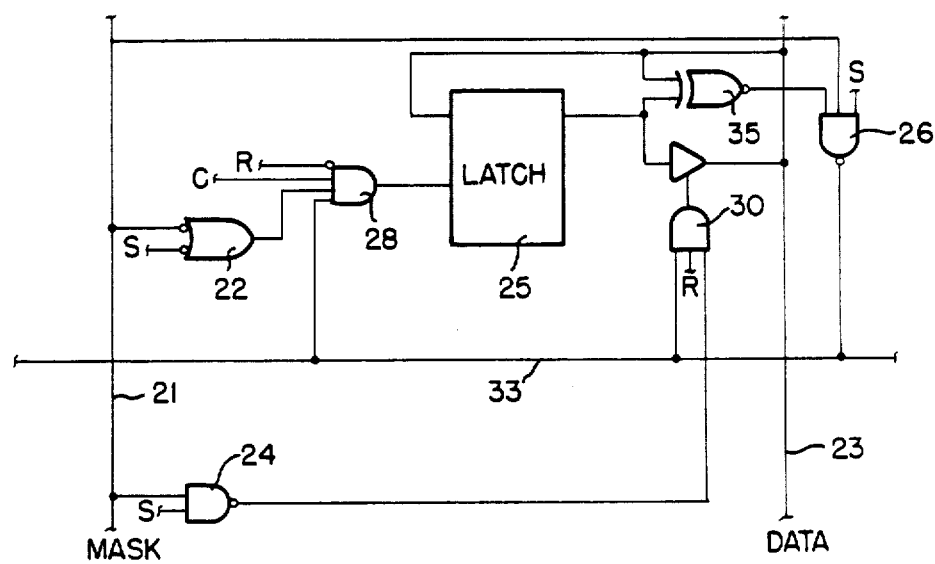
FIG. 2 is a logic block diagram of a single memory cell, for one bit of data, of the memory storage array portion of the device of FIG. 1.

FIG. 2 shows a logic diagram for a single cell in CAM 11, i.e. the structure which stores one bit of data. As mentioned above, CAM 11, and hence the individual storage cells therein, can operate either in a RAM mode, in which data is written into and read out of the memory and is randomly accessed according to physical location, or it can operate in an associative mode, in which the data stored in the memory is addressed in parallel and searched against a predetermined search pattern, i.e. searched by content.

The condition of signal lines labeled "S" in FIG. 2, along with the condition of the mask line 21, determines whether the cell shown in FIG. 2 operates in the RAM mode or the associative mode. The S lines are shown as input terminals to OR-NOT gate 22, NAND gate 24, and NAND gate (open collector) 26. When the S signal is low, and mask line 21 is low, the cell is in RAM mode and data may be written into and read out of the cell. A data bit is stored in latch 25. Data is written into latch 25 on data line 23, controlled by the clock signal input (line C) to AND gate 28. Data is read out of the cell, again on data line 23, when the "R" input signal lines to AND gate 28 and AND gate 30 are high. Address decoder 15, which interfaces with the memory array 11, accesses the actual physical location in memory for the reading/writing of data. All other locations in memory are disabled.

Figure 3:
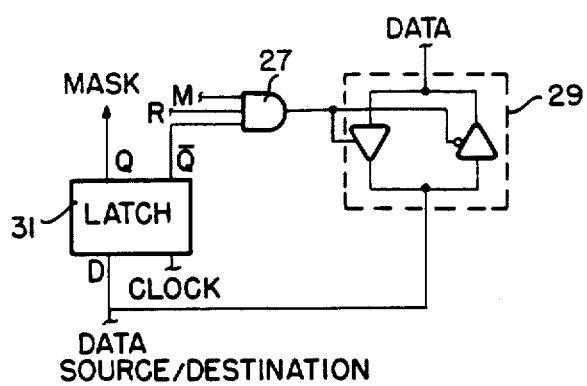
FIG. 3 is a logic block diagram of the data and mask block portion of the device of FIG. 1.

The reading/writing of data is accomplished by the circuit shown in logic form in FIG. 3, referred to as the mask/data drive circuit in FIG. 1. When the memory is in the RAM mode, the M (match) input line to AND gate 27 is always high. The "R" input line to AND gate 27 is high when data is to be read out of memory, and is low otherwise. Data from an external data source is written into and read out of the cell shown in FIG. 2 through a bidirectional driver 29 (FIG. 3), comprised of two inverters connected as shown. The "data" output line from the circuit in FIG. 3 connects to data line 23 for the memory cell shown in FIG. 2. The data source/destination indication represents a selected external source or destination for the data.

When the device of FIG. 1 as a whole is in an associative mode (to perform an associative search), address decoder 15 is not enabled, address encoder 19 is enabled, and the S signal lines are high (FIGS. 1 and 2). The mask signal lines (input lines to gates 22, 24, 26) are high for the selected positions in the search word which are to be used for the associative search. The associated CAM cells, for those bit positions, cannot be read/written. The mask line from FIG. 3 is connected to the mask line 21 shown in FIG. 2. The mask latch 31 is loaded from data supplied by the external data source, by means of a clock signal input. An indicated above, a high state on the Q line of the latch indicates that the bit position of the search word is to be used for the associative search, while a low state on the Q line indicates that the bit position of the search word will not be used for the search but will always be in effect in RAM mode. Both the mask and data lines 21 and 23 are essentially bus lines which run through each word location in the associative memory. The same external pins are used for both mask and data drive, which results in pin savings.

A word select line 33 runs through the cell shown in FIG. 2, and all the subsequent cells, across the width of the memory, which as a group contain a data word. Thus, word select line 33 is in effect a bus line through one word location in memory. Each word location in CAM array 11 has such a bus line extending through it, and the word select lines are the output lines for the CAM 11.

The word select line 33 is initially high. For those bit positions where the mask signal is high, the search pattern is moved through bidirectional driver 29, and compared with the data in the latch 25 through exclusive OR gate 35. If there is a match, line 33 will remain high, but if there is not a match, NAND gate 26 will pull word select line 33 low. One nonmatch for any bit in a given word will result in the word select line 33 being pulled low. Thus, a low on the line 33 from memory indicates a nonmatch for that particular word in memory, while a high indicates a match.

Figure 4:
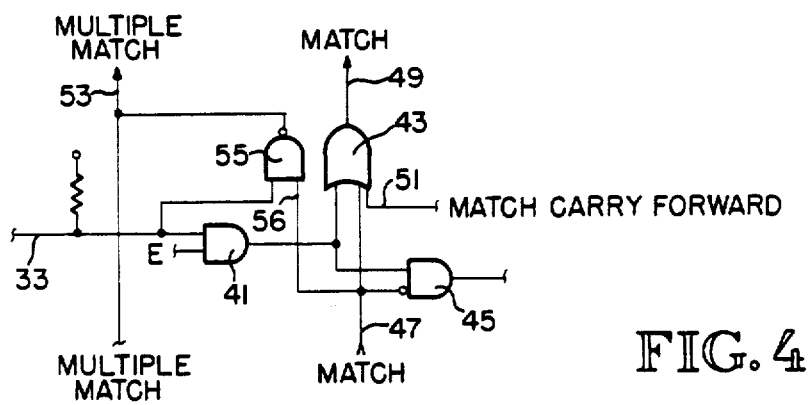
FIG. 4 is a logic block diagram of one match detect circuit, for one word of data in memory, in the match detect block portion of the device of FIG. 1.

FIG. 4 shows one match detect circuit 17 in logic form. There is one such circuit for each word in CAM array 11, and hence, there in one such circuit for each word select line 33 from CAM 11. The basic operational purpose of the plurality of match detect circuits 17 in the associative memory is to pass matches in a set priority to address encoder 19. Word select line 33 from a set of memory cells containing a word is applied as one input signal to AND gate 41. The other input signal to AND gate 41 is an enable signal, which is high when the device is to operate in the associative mode. The output signal of AND gate 41 is passed to an OR gate 43 and an output AND gate 45. The other input to output AND gate 45 is a match line 47 from the match detect circuit for the previous or next lowest word location in the memory configuration.

If there has been a match for any previous word in memory, the signal on match line 47 will by high. Otherwise, the signal on line 47 will be low. If the signal on line 47 is low, indicating no previous matches, and the signal from AND gate 41 is high, indicating a match for the current word, the output signal of output AND gate 45 will be high. If the signal on line 47 is high, indicating a previous match, the output signal of gate 45 will be low. Thus, only one output line among the plurality of the output lines from the match detect circuits will be high, no matter how many matches there are in memory. The match indication will be that for the first or lowest word in memory.

The output signals of AND gate 41 and match line 47 from the next lowest match detect circuit are also applied as inputs signals to OR gate 43. The output line of OR gate 43, line 49, is the match line for the next highest match detect circuit. Once one match has occurred, the output match line for all higher match detect circuits will be high.

It is possible to improve the speed of the associative search and hence the performance of the memory device as a whole by including a match carry forward input line to selected ones of the match detect circuits. This is illustrated by line 51 in FIG. 4. In many applications of the present invention with a 256×16 CAM array, four match detect circuits will have such a line 51. The carry forward line carries a match indication from a match detect circuit which is a selected number of positions lower in the array than the match detect circuit shown. In a particular embodiment, the carry forward may be on the basis of the square root of the size of the array, so that the carry is 16 positions forward. This results in improved performance, as the match information for the memory device as a whole is achieved significantly faster.

Each match detect circuit, and also the block of match detect circuits 17 as a whole, also provides a multiple match indication, on line 53 (FIG. 4). The multiple match line 53 is a bus line, which runs through each match detect circuit. A multiple match indication occurs when there is a previous match indication at one input terminal to NAND gate 55 (open collector) on line 56, and a current match indication at the other input terminal, from line 33. When this condition occurs, line 53 is pulled low and remains low through the action of NAND gate 55.

The output lines from the plurality of match detect circuits (AND gates 45) are applied to a conventional address encoder 19, which is enabled when the device is in the associative mode. As mentioned above, only one of the lines from the match detect circuits to the address encoder will be high, i.e. that particular line associated with the lowest word in memory having the first match. The address encoder 19 then locates that particular word in memory and provides an indication of its location. The address encoder 19 is implemented on the memory chip itself, resulting in a savings of external logic.

Figure 5:
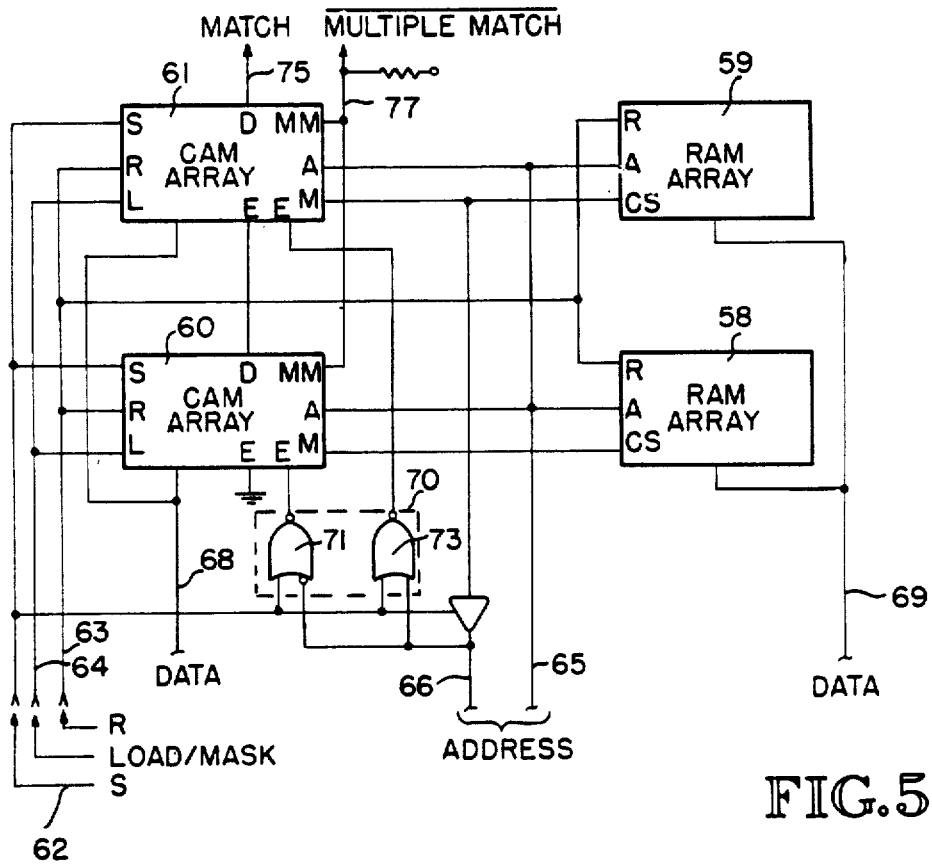
FIG. 5 is a logic block diagram of the associative memory of the present invention shown in a cascaded implementation.

FIG. 5 shows a cascaded memory using CAMS and RAMS, which has an effective width of 32 bits, as opposed to 16 bits. The memory of FIG. 5 operates either in an associative mode or a RAM mode. RAMS 58 and 59 always function as RAMS, whether the memory as a whole is in the associative mode or in a RAM mode. The CAMS 60 and 61 function either as a CAM when the memory is in the associative mode, or as RAMS, in the manner as discussed above, when the memory is in the RAM mode. Although two CAMS and two RAMS are shown for illustration, it should be understood that additional CAMS and RAMS can be added, in similar fashion to that shown, to further increase the size of the memory as a whole.

When the memory system is operating in the RAM mode, the "S" line 62 is low and "R" line 63 is low or high, depending on whether data is to be written or read. The state load/mask line 64 clocks the mask latch in the manner discussed above. The desired address location in the memory is provided on address lines 65 and 66. Initially, only one CAM, out of the plurality of CAMS in the system, is selected, and the match (M) output signal from that particular CAM activates its associated RAM through the RAM's chip select (CS) input. The same selection process occurs for both reading and writing. The exact desired address in the memory is then accessed by the address inputs on lines 65 and 66 through the address (A) inputs on both the CAMS and the RAMS. Data is written into and read out of the CAM arrays and the RAM arrays through their respective data lines 68 and 69.

When the memory system is in the associative mode, "S" line 62 is high and the read/write functions of the CAMS are disabled. The search pattern is applied to the memory system through the CAM data line 68, and compared as explained above with the contents of the memory. Each CAM has two enable (E) terminals. One enable input terminal is coupled to an address decoder 70 comprised of two NOR gates 71 and 73. NOR gates 71 and 73 pull one enable line low on each CAM so that all the CAMS are active. The D output terminal of each CAM is coupled to the other enable input terminal on the next successive CAM to provide a disable signal. This D output line is high when a match has occurred in the prior CAM. This disable signal is passed through to all successive CAMS and results in an indication on line 75 from the memory that a match has in fact occurred in the memory.

If a multiple match occurs in any of the CAMS, an indication thereof, on output line MM, is provided by the circuit, including resistor 76. The indication of a multiple match in the memory system occurs on line 77. The address lines 65 and 66 are enabled in the associative mode only when there has been a system match. This provides a capability of obtaining an output from the system.

Thus, with the arrangement of FIG. 5, the effective word length of the associative memory may be substantially increased, without sacrificing associative searching ability. Furthermore, the arrangement of FIG. 5 shows how an associative memory may be conveniently increased in length without a substantial amount of external logic. No decoding logic for the RAMS are necessary when the device is in the associative mode because the associated RAMS are selected through the match line from the CAM, and the address lines are used to directly access the proper location in the RAMS.

Hence, an associative memory has been disclosed which reduces the number of external pin connections necessary, as well as the amount of external logic. The memory may also be conveniently cascaded to increase both its width and length without substantial additional external logic structure and without sacrifice of associative search performance.

Although a preferred embodiment of the invention has been disclosed herein for illustration, it should be understood that various changes, modifications and substitutions may be incorporated in such embodiment without departing from the spirit of the invention as defined by the claims which follow.

What is claimed is:

1. An associative memory device capable of both conventional operation and associative operation, comprising:
    a memory array, including first means for searching the data in the memory associatively to match words in accordance with a given search pattern;
    second means coupled to the memory array for accessing said memory array by physical location;
    third means coupled to the memory array for loading data into said memory array and reading data from said memory array when the memory device is enabled for conventional operation, and for providing a search pattern and a masking signal to said memory array and for accessing matched words in said memory array when the memory device is enabled for associative operation;
    a plurality of match detect circuit means coupled to the memory array, one for each word location in said memory array, said plurality of match detect means for providing an output signal associated with the location of the first match in said memory array means; and
    fourth means coupled to said match detect circuit means for determining the physical location in said memory array containing said first match.

2. An apparatus of claim 1, wherein the loading/reading of data in the conventional operation of said memory array is accomplished through the same pin connections used for the search pattern and the masking signal in the associative operation of said memory array.

3. An apparatus of claim 1, further including fifth means coupled to the second means for enabling the second means only when said memory array is to operate conventionally and sixth means coupled to the fourth means for enabling said fourth means only when said memory array is to operate associatively.

4. An apparatus of claim 1, wherein said match detect circuit means includes seventh means for detecting multiple matches within said memory array and providing an output indication thereof.

5. An apparatus of claim 4, wherein each match detect circuit means includes eighth means for applying indications of a match and multiple match to the next successive match detect circuit means.

6. An apparatus of claim 1, wherein said match detect circuit means includes ninth means for providing only the first match indication to said fourth means and tenth means for insuring that the output signals of the remaining match detect circuit means applied to said fourth means do not indicate a match.

7. An apparatus of claim 6, further including tenth means for providing an indication of a match from one selected match detect circuit means to a match detect circuit means beyond the next successive one.

8. An apparatus of claim 1, including eleventh means for cascading each memory element in said memory array, to increase the size of the memory device.

9. An apparatus of claim 8, further including a plurality of CAM memory means and a plurality of RAM memory means, each RAM memory means being uniquely associated with a CAM memory means, said CAM memory means capable of operating conventionally and associatively, said RAM memory means operating conventionally at all times, each CAM memory means including twelfth means for selecting its associated RAM memory means when said each CAM memory means is enabled.

10. An associative memory, comprising:
    an associative memory array, including first means for searching the data in the memory associatively for matching words in accordance with a given search pattern;
    second means coupled to the memory array for providing a search pattern and a masking signal to said memory array and for accessing matched words in said memory array;
    a plurality of match detect circuit means, one for each word location in said memory array, said plurality of match detect circuit means for providing an output signal associated with the location of the first match in said memory array means; and
    third means coupled to said match detect circuit means for determining the physical location in said memory array containing said first match.

11. An apparatus of claim 10, wherein said plurality of match detect circuit means includes fourth means for detecting multiple matches within said memory array and providing an indication thereof.

12. An apparatus of claim 11, wherein each match detect circuit means includes fifth means for applying indications of a match and multiple match to the next successive match detect circuit means.

13. An apparatus of claim 10, wherein said match detect circuit means includes sixth means for providing only the first match indication to said third means and seventh means for insuring that the output signals of any other match detect circuit means applied to said third means do not indicate a match.

14. An apparatus of claim 13, further including eighth means for providing an indication of a match from one selected match detect circuit means to a match detect circuit means beyond the next successive one.

* * * * *